United States Patent [19]

Nishikawa

[11] Patent Number: 5,280,255

[45] Date of Patent: Jan. 18, 1994

[54] INPUT-WEIGHTED TRANSVERSAL FILTER

[75] Inventor: Masaki Nishikawa, Yokohama, Japan

[73] Assignee: Kabushiki Kaisha Toshiba, Kawasaki, Japan

[21] Appl. No.: 838,098

[22] Filed: Feb. 20, 1992

[30] Foreign Application Priority Data

Feb. 21, 1991 [JP] Japan .................................. 3-027318

[51] Int. Cl.$^5$ ............................................ H03H 15/00
[52] U.S. Cl. .............................. 333/166; 364/724.160
[58] Field of Search .................... 333/166; 364/724.16, 364/724.17

[56] References Cited

U.S. PATENT DOCUMENTS

| | | |
|---|---|---|
| 3,521,042 | 7/1970 | Van Blerkom et al. ........ 364/724.16 |
| 3,665,171 | 5/1972 | Morrow .......................... 364/724.16 |
| 3,979,701 | 9/1976 | Tomozawa ........................... 333/166 |
| 4,185,325 | 1/1980 | Appel ............................. 364/724.17 |
| 4,314,277 | 2/1982 | Pritchard et al. ........... 364/724.16 X |

FOREIGN PATENT DOCUMENTS 1268305 10/1989 Japan .

OTHER PUBLICATIONS

Shri Goyal et al, Performance Evaluations of Selected Automatic Deghosting Systems for Television, IEEE Transactions on Consumer Electronics, vol. CE-26, Feb. 1980, pp. 100-120.

Primary Examiner—Benny Lee
Attorney, Agent, or Firm—Cushman, Darby & Cushman

[57] ABSTRACT

An input-weighted transversal filter having a first input circuit for inputting a sampled input signal which is sampled at every predetermined period, registers for storing a predetermined number of tap weights, the register selectively supplying the tap weights in a predetermined order, a plurality of tap weight multipliers for multiplying the sampled input signal and a tap weight supplied from the registers, a pipeline processing adder for adding the multiplied outputs from the tap weight multipliers with each other and a second input circuit for inputting signals to the pipeline processing adder, the second input circuit having at least one input coupled to the output of the pipeline processing adder.

3 Claims, 9 Drawing Sheets

INPUT-WEIGHTED TRANSVERSAL FILTER

FIELD OF THE INVENTION

The present invention relates to a transversal filter, and more particularly to an input-weighted filter which performs a realtime filtering operation for input signals.

BACKGROUND OF THE INVENTION

A filter which digitally processes input signals at a realtime operation has been discussed in, for instance, "PERFORMANCE EVALUATIONS OF SELECTED AUTOMATIC DEGHOSTING SYSTEMS FOR TELEVISION" in "IEEE Transactions on Consumer Electronics, Vol. CE-26, February 1980".

Figure 1:
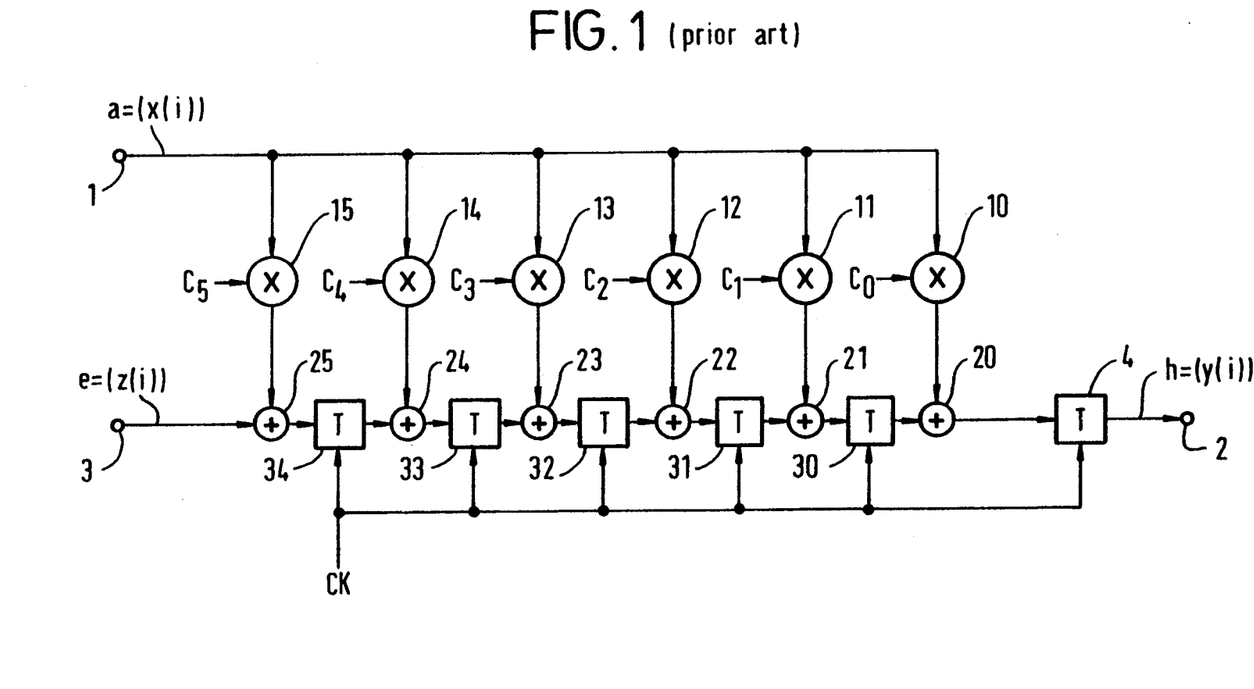
FIG. 1 is a circuit diagram showing a conventional input-weighted transversal filter.

FIG. 1 shows a conventional six tap input-weighted transversal filter (hereinafter referred generally to as a transversal filter). This transversal filter shows a part of a large-scale transversal filter provided with many taps.

An input signal $a = \{x(i)\}$, sampled at every period T, is inputted to six tap weight multipliers 10, 11, 12, 13, 14, 15 via an input terminal 1. The tap weight multipliers 10, 11, 12, 13, 14, 15 multiply the input signal a by respective tap weights C0, C1, C2, C3, C4, C5 associated thereto and output their multiplication results to adders 20, 21, 22, 23, 24, 25, respectively. Further, a cascade input signal $e = \{z(i)\}$ is input to the adder 25 through a cascade inputted terminal 3. The adders 20, 21, 22, 23, 24, 25 have been connected in series so that they are positioned alternately with delay elements 30, 31, 32, 33, 34 and the output from the adder 20 is fed to an output terminal 2 through a last stage delay element 4. The delay elements 30, 31, 32, 33, 34, 4 are driven by a clock signal CK.

An output signal $h = \{y(i)\}$ of the last stage delay element 4 of the transversal filter is expressed by the following equation:

$$y(i) = \sum_{j=0}^{5} C(j) \cdot x(i - j - 1) - z(i - 6) \quad (1)$$

c(j) represents tap weight values, where j is a number of tap weights. $X(i-j-1)$ is an input signal which is sampled over a period of time. $Z(i-6)$ represents a cascade input signal at a particular period of time.

This output signal $\{y(i)\}$ will become the final output signal of the transversal filter.

The cascade input terminal 3 is provided for coupling these transversal filters in series. Thus, when the transversal filter is one element, such a cascade input terminal is omitted from the circuit arrangement.

The arithmetic operation shown by the equation (1) has been used in many fields. In particular, in the fields of television deghosting technique and a digital processing technique of television signals, it is used at T=70 to 93 ns ($10^{-9}$ sec.) and to execute the equation (1) at high speed in a realtime operation, ROMs (Read Only Memories) and RAMs (Random Access Memories) have been used for the tap weight multipliers 10, 11, 12, 13, 14, 15 in addition to random logic multipliers.

Now, when considering a fabrication of the transversal filter onto an integrated circuit (IC) chip, the circuit-scale of these tap weight multipliers becomes relatively large and the number of taps that can be secured by one chip is no more than 64 taps. Normally, in deghosting devices transversal filters are used at 14.32 MHz, which is four times of the color subcarrier frequency fsc at the NTSC system. Thus, the period is calculated as T=70 ns. At this time, a 64 tap transversal filter will have a sampling period of 4.4 μs. It is generally said that the 90% of ghosts are generated in a range of delay time from −1 to 24 μs. To realize a practical deghosting device that copes with ghosts in this range, transversal filters having more than 357 taps are required. In other words, more than six IC chips become necessary and it becomes expensive for reasons that many component parts are required and required chip-scale becomes large.

As described above, conventional transversal filters enabling realtime operation at high speed have such problems that the circuit-scale of the tap weight multiplier becomes large and a sufficient number of taps cannot be obtained even when the filter is made in IC chips.

SUMMARY OF THE INVENTION

It is, therefore, an object of the present invention to provide an input-weighted transversal filter which is capable of realizing a transversal filter equivalent to a filter having a large number of taps with a small number of taps.

In order to achieve the above object, the input-weighted transversal filter has a first input circuit for inputting a sampled input signal which is sampled at every predetermined period, registers for storing a predetermined number of tap weights, the register selectively supplying the tap weights in a predetermined order, a plurality of tap weight multipliers for multiplying the sampled input signal and a tap weight supplied from the registers, a pipeline processing adder for adding the multiplied outputs from the tap weight multipliers with each other and a second input circuit for inputting signals to the pipeline processing adder, the second input circuit having at least one input coupled to the output of the pipeline processing adder.

The tap weight multipliers of the present invention operate on the basis of time-division multiplexing and multiply input signals sampled at every period T by a tap weight which changes n (n is a natural number not less than 2) times during the period T. Outputs from the tap weight multipliers are added up by the pipeline processing adder and the output from this pipeline processing adder is outputted as a filtered output signal sampled at every period T described above. At the same time, part of the output from this pipeline processing adder is inputted to the input selecting means provided at the input of the pipeline processing adder itself. This input selecting means is so constructed that it changes over the output from the pipeline processing adder and another adding input at least twice during the period T.

Further, the pipeline processing adder is equipped with a plurality of adders, to which outputs from a plurality of tap weight multipliers described above are inputted, and delay means consisting of n delay elements, each of which has a delay time (T/n) connected in series among the plurality of adders.

As the tap weight multipliers are used on the basis of time-division multiplexing during the period T, a plurality of tap weight multiplication results can be obtained from the delay elements of the pipeline processing adder during the period T. A part of the multiplication results which has an insufficient delay time is again applied to the input of the pipeline processing adder and passes through the delay element line again, Thus, a properly filtered output signal with sufficient delay times can be obtained.

As described above, a tap weight multiplier has the function of a plurality of conventional tap weight multipliers and a required number of the tap weight multipliers can be reduced. Further, if a large number of the tap weight multipliers are used, it becomes possible to greatly increase the number of taps.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

The present invention will be described in detail with reference to the FIG. 2 through FIG. 9. Throughout the drawings, reference numerals or letters used in FIG. 1 will be used to designate like or equivalent elements for simplicity of explanation.

Figure 2:
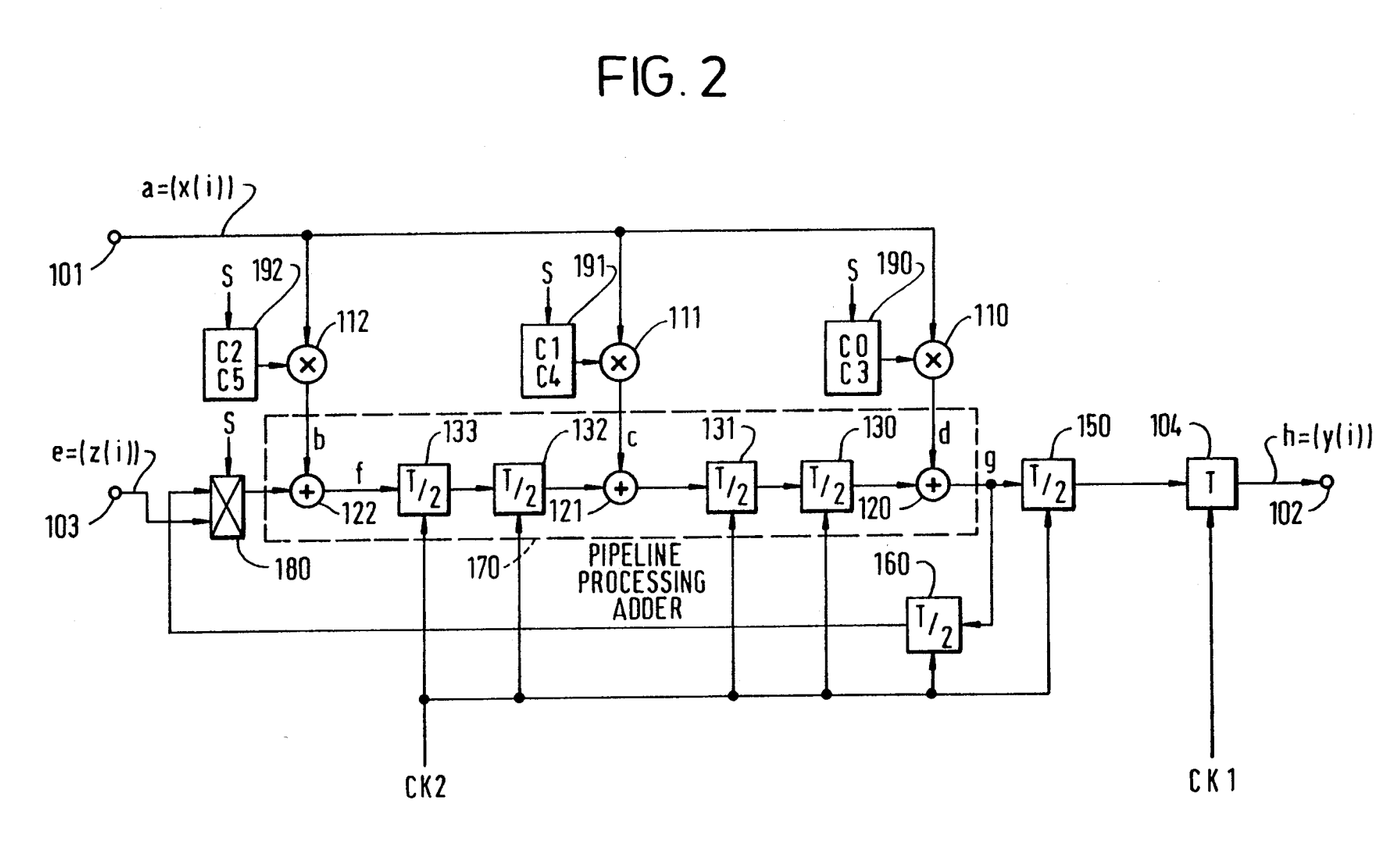
FIG. 2 is a circuit diagram showing a first embodiment of the input-weighted transversal filter according to the present invention.
Figure 3:
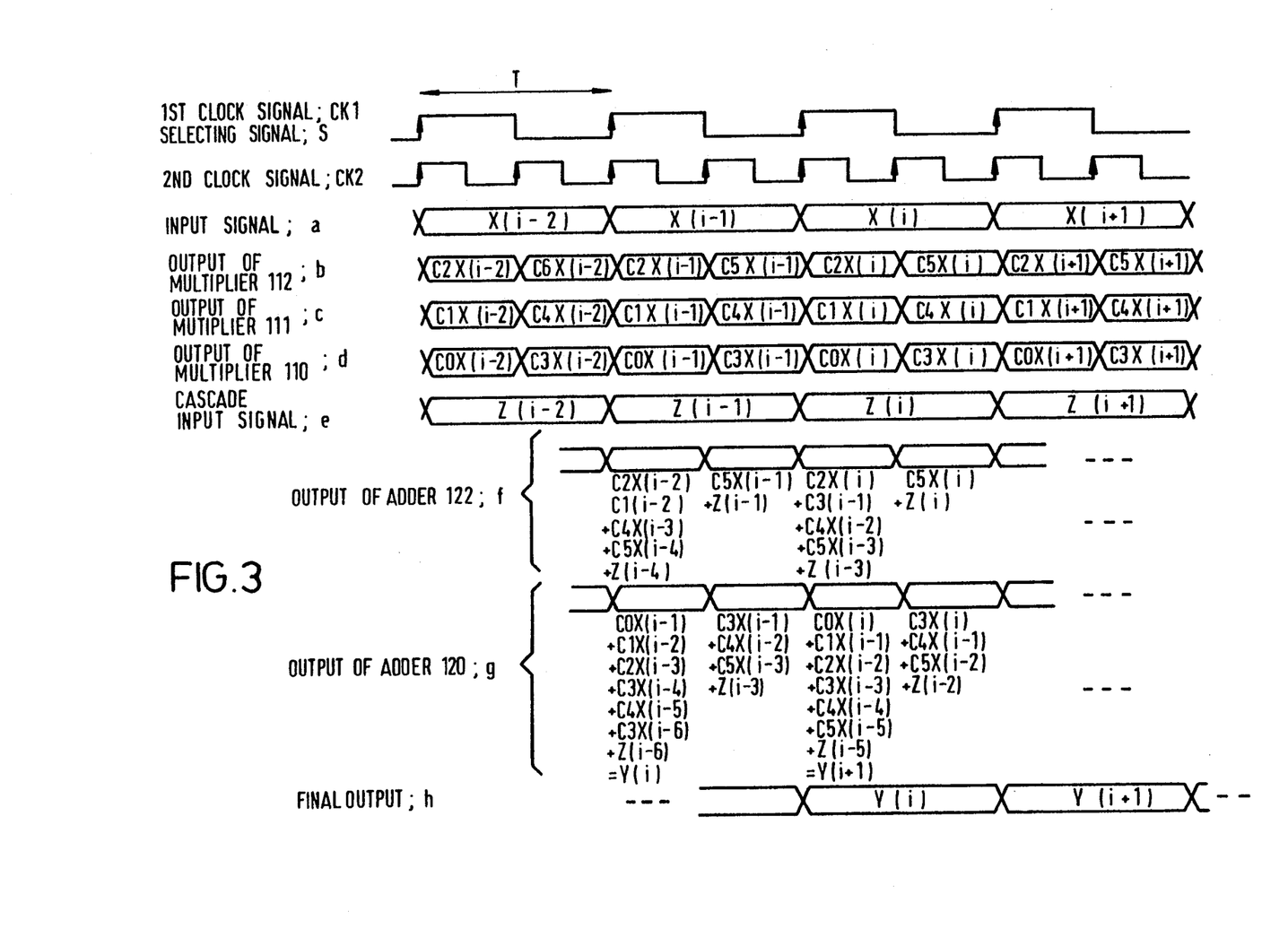
FIG. 3 is a timing chart for explaining the operation of the circuit shown in FIG. 2.
Figure 4:
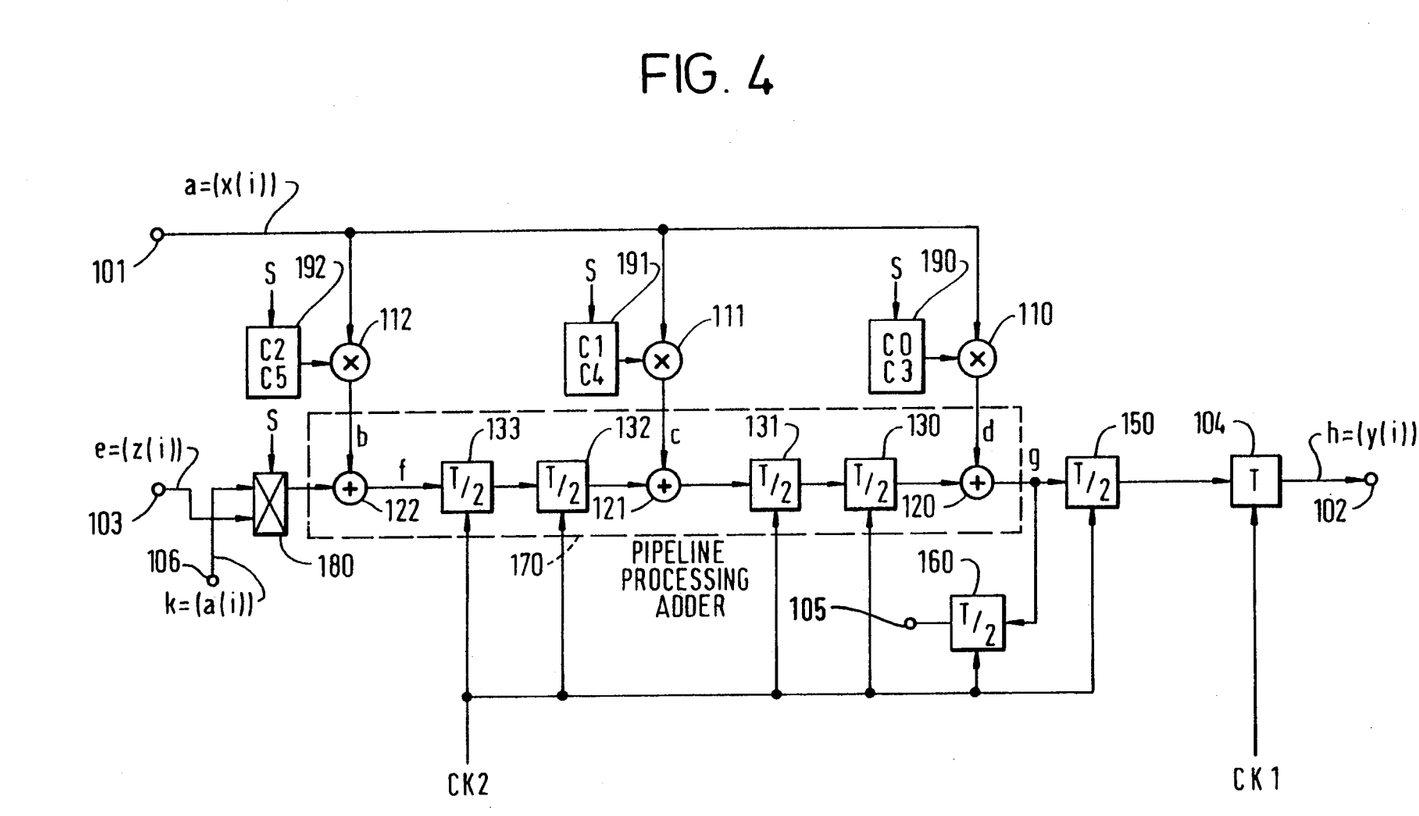
FIG. 4 is a modification of the circuit diagram of FIG. 2 for explaining the operation of the first embodiment.

Referring now to FIGS. 2 to 4, a first embodiment of the input-weighted transversal filter according to the present invention will be described in detail.

FIG. 2 shows a first embodiment of input-weighted transversal filter according to the present invention. The first embodiment is embodied in that the scale of 6 taps, similar to the conventional transversal filter as shown in FIG. 1, is realized by time-division multiplexing where n=2, this delay time is T/2.

An input signal $a=\{x(i)\}$, sampled at every period T, is to the inputted terminal 101. This input signal a is inputted to the tap weight multipliers 110, 111, 112. The tap weight multipliers 110, 111, 112 are provided with tap weights from registers 190, 191, 192, respectively. These tap weights are changed between two kinds in the respective tap weight multipliers during the period T. Tap weights C0, C3 are selected in the register 190, the tap weights C1, C4 in the register 191, and the tap weights C2, C5 in the register 192. The registers 190, 191, 192 select the tap weights with smaller suffixes (C0, C1, C2) when the selecting signal S is "1" and the tap weights with larger suffixes (C3, C4, C5) when the signal S is "0".

The outputs of the tap weight multipliers 110, 111, 112, which correspond to d, c, and b, respectively, are inputted to the adders 120, 121, 122, respectively. Between the adders 120, 121 the delay elements 130, 131 each having the delay time (T/2=T/n) are connected in series. Also, between the adders 121, 122 the delay elements 132, 133 each having the delay time (T/2=T/n) are connected in series output signal f is generated from adder 122, for example.

The delay circuit from the adder 120 to the adder 122 forms the pipeline processing adder 170.

The output g of this pipeline processing adder 170 is inputted to the delay element 150 having the delay time (T/2=T/n). The output of the delay element 150 is inputted to the last stage delay element 104 having the delay time T, which outputs filtered $h=\{y(i)\}$. The output of this last stage delay element 104 is connected to the output terminal 102. Further, the output of the pipeline processing adder 170 is inputted to the delay element 160 having the delay time (T/2=T/n).

The cascade input signal $e=\{z(i)\}$, sampled at every period T, is inputted to the cascade input terminal 103. This sampling series signal e is inputted to the selector 180. The sampled signal e and the output of the delay element 160 are supplied to the selector 180 where these two kinds of signals are selected during the period T. The selector 180 selects the output of the delay element 160 when the selecting signal S is "1", while the sampled signal e is selected when the selecting signal S is "0". The output from the selector 180 is connected to the adder 122 in the pipeline processing adder 170.

FIG. 3 is a timing chart for explaining the operation of the first embodiment of the transversal filter.

Before explaining the time chart of FIG. 3, the basic operation of the first embodiment will be explained in reference to FIGS. 4 and 5.

FIG. 4 is a modified circuit diagram of FIG. 2 for explaining in detail the first embodiment of the present invention shown in FIG. 2. FIG. 4 is entirely the same as FIG. 2 except that a connection between the output of the delay circuit 160 and the input of the selector 180, which presents in FIG. 2, is omitted. Thus, like references refer to like elements. The delay element 160 has a virtual output terminal 105, while the selector 180 has a virtual inputted terminal 106 for receiving a virtual input signal $k=\{a(i)\}$. The virtual input signal k is provided to be input to the selector 180 only when the selecting signal S of the selector 180 is "1". Since the operations of the components, signals and assigned symbols are all the same as those shown in FIG. 2, the explanations of the components etc., will be omitted hereinafter.

Figure 5:
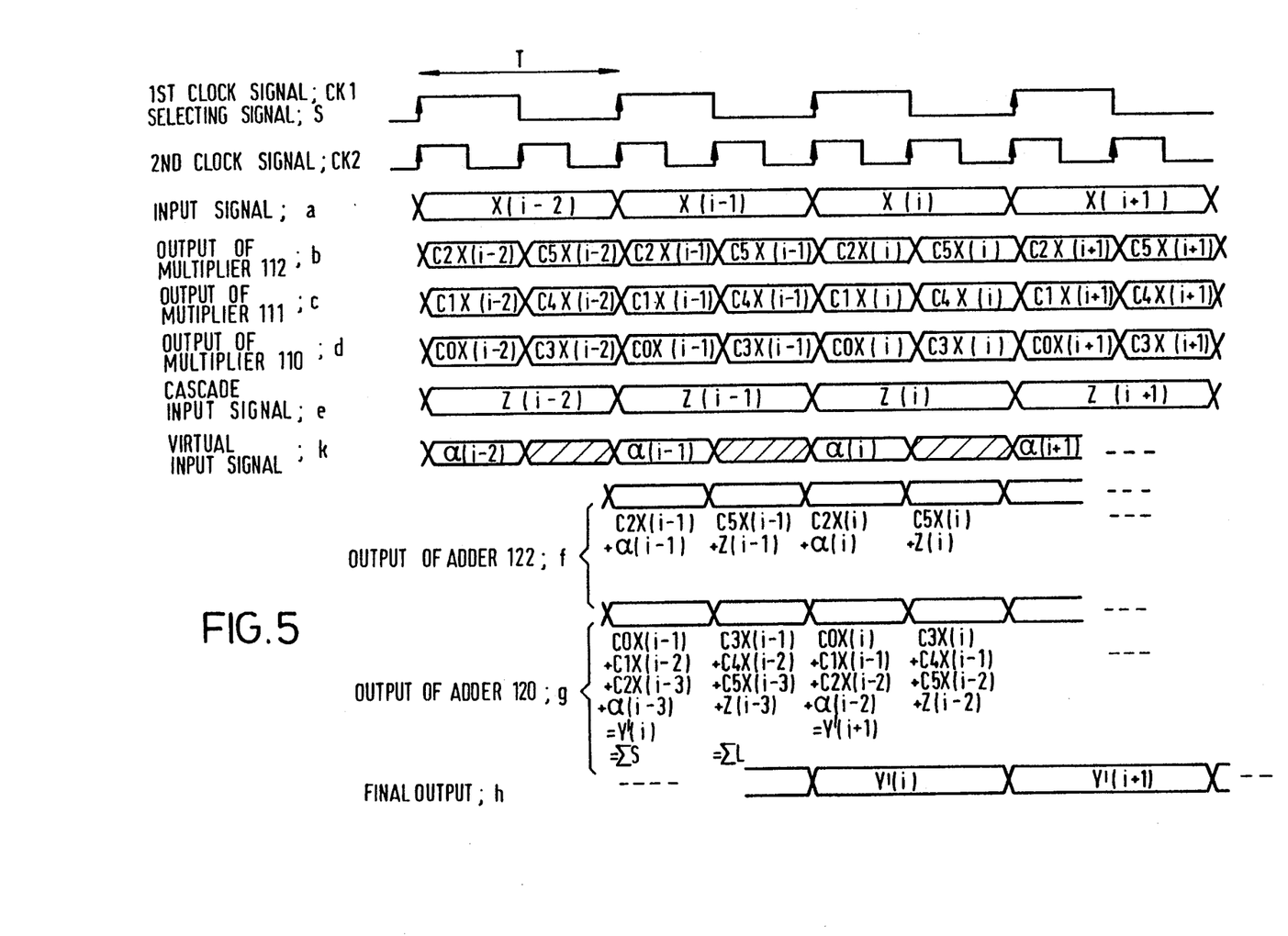
FIG. 5 is a timing chart for explaining the operation of the circuit shown in FIG. 4.

FIG. 5 is a timing chart for explaining the operation in FIG. 4. As shown in FIG. 5, the selecting signal S and the clock signal CK1 used in the last stage delay element 104 have the period T and the clock pulse CK2 has the period (T/2=T/n).

In the present invention, it is assumed that a period of CK1 is equally divided into n sections by the second clock signal CKn having n times (n is an integer not less than 2) the frequency of the clock signal CK1, and the n sections are called Phase 1, Phase 2, ... Phase n in regular order of time. FIGS. 2, 4 show a particular case having the two of Phase 1 and Phase 2.

As the input signal a is sampled at the period T, the data of the input signal a changes in the following order at the period T of the clock signal CK1 and signal S:

$$x(i-2), x(i-1), x(i), x(i+1), \ldots$$

As the tap weights being selected by the period (T/2), the outputs d, c, b of the tap weight multipliers 110, 111, 112 change in following orders.

In case of the output d of the tap weight multiplier 110:

$$C0.x(i-2), C3.x(i-2), C0.x(i-1), C3.x(i-1),$$
$$C0.x(i), C3.x(i), C0.x(i-1), C3.x(i+1), \ldots$$

In case of the output c of the tap weight multiplier 111:

$$C1.x(i-2), C4.x(i-2), C1.x(i-1), C4.x(i-1),$$
$$C1.x(i), C4.x(i), C1.x(i+1), C4.x(i+1), \ldots$$

In case of the output b of the tap weight multiplier 112:

$$C2.x(i-2), C5.x(i-2), C2.x(i-1), C5.x(i-1),$$
$$C2.x(i), C5.x(i), C2.x(i+1), C5.x(i+1), \ldots$$

Further, as the cascade input signal e being sampled at the period T, the data content of the signal e changes in the following order, at the period of the clock signal CK1 and signal S:

$$z(i-2), z(i-1), z(i), z(i+1), \ldots$$

As to the virtual input signal k, as the signal $\{\alpha(i)\}$ sampled at every period T being inputted when the selecting signal S is "1", the data content of the virtual input signal k changes in the following order, at the periods of the "1" and "0" of the selecting the clock signal CK1 and signal S:

$$\alpha(i-2), *, \alpha(i-1), *, \alpha(i), *, \alpha(i+1), *, \ldots$$

where the contents of the data * are not important.

As the selector 180 being operated at the period (T/2), the output f of the adder 122 changes in the following order.

$$C2.x(i-2)+\alpha(i-2), C5.x(i-2)+z(i-2),$$
$$C2.x(i-1)+\alpha(i-1), C5.x(i-1)+z(i-1),$$
$$C2.x(i)+\alpha(i), C5.x(i)+z(i), C2.x(i+1)+\alpha(i+1),$$
$$C5.x(i+1)+z(i+1), \ldots$$

FIG. 5 only shows output f at the sampled period $(i-1)T$ and $(i)T$. When adding the outputs d, c, b of the tap weight multipliers 110, 111, 112 in the pipeline processing adder 170, if the time difference among the outputs d, c, b of the tap weight multipliers 110, 111, 112 is set by n (2 in this embodiment) delay elements for the number (n) of tap weights which are selected in each of the tap weight multipliers, a first output sum $\Sigma S$ of the outputs at the selection of the tap weights with smaller suffixes and the output sum $\Sigma L$ of the outputs at the selection of the tap weights with larger suffixes, alternately for Phase 1 and Phase 2, respectively. For instance, when taking the period $(i-1)T$ as example, in Phase 1 of the period $(i-1)T$, the first output sum $\Sigma S$ as follows appears as the output g of the adder 120;

$$\Sigma S = C0.x(i-1)+C1.x(i-2)+C2.x(i-3)+\alpha(i-3).$$

In Phase 2 the second output sum $\Sigma L$ as follows appears as the output g of the adder 120;

$$\Sigma L = C3.x(i-1)+C4.x(i-2)+C5.x(i-3)+z(i-3).$$

If the first output sum $\Sigma S$ is delayed by (T/2) by the delay element 150 of the period (T/2) and further, it is held in the last stage delay element 104 for the period T, the second output sum $\Sigma L$ is ignored and the final output h appears at the output terminal 102 as shown in FIG. 5 and the following signal is obtained as the output signal $\{y'(i)\}$:

$$y'(i) = C0.x(i-1)+C1.x(i-2)+C2.x(i-3)+\alpha(i-3) \quad (2)$$

$y'(i+1) = y'(i)$ sampled at the next time period. In the output g of the adder 120, if the second output sum $\Sigma L$ is advanced by (T/2), it becomes the same phase as the first output sum $\Sigma S$. So, if the second output sum $\Sigma L$ is added to the first output sum $\Sigma S$ by delaying 2.5 T and further the virtual input signal k $(=\{\alpha(i)\})$ is made 0, the equation (2) will become the same form as the equation (1), as shown in the following equation:

$$C0 \cdot x(i-1) + C1 \cdot x(i-2) + C2 \cdot x(i-3) + C3 \cdot x(i-4) +$$
$$C4 \cdot x(i-5) + C5 \cdot x(i-6) + z(i-6) =$$
$$\sum_{j=0}^{5} C(j) \cdot x(i-j-1) + z(i-6)$$

If the output g is established in the adder 120 and then this output g is delayed by (T/2) by the delay element 150 having the period (T/2) and held in the last stage delay element 104 for the period T, the following output signal $\{y'(i)\}$ is obtained as the final output h from the $$y'(i) = C0 \cdot x(i-1) + C1 \cdot x(i-2) + C2 \cdot \quad (3)$$
$$x(i-3) + C3 \cdot x(i-4) + C4 \cdot x(i-5) +$$
$$C5 \cdot x(i-6) + z(i-6)$$
$$= \sum_{j=0}^{5} C(j) \cdot x(i-j-1) + z(i-6)$$

This is equivalent to the required output of the transversal filter shown by the equation (1). In other words, to get a required output of the transversal filter, it is necessary to extend the second output sum $\Sigma L$ by 2.5 T more than the first output sum $\Sigma S$.

Now, if the virtual output terminal 105 is connected to the virtual input terminal 106 for coupling the output of the delay element 160 to the selector 180, $\alpha(i) = \Sigma L$ is established when the second output sum $\Sigma L$ is delayed for the period (T/2) by the delay element 160. In this condition, the arrangement shown in FIG. 4 becomes equivalent to the arrangement shown in FIG. 2. Now $\alpha(i) = \Sigma L$ is substituted for the equation (2), and the following equation is established.

$$\begin{aligned} y'(i) &= C0 \cdot x(i-1) + C1 \cdot x(i-2) + C2 \cdot \\ &\quad x(i-3) + C3 \cdot x(i-4) + C4 \cdot x(i-5) + \\ &\quad C5 \cdot x(i-6) + z(i-6) \\ &= \sum_{j=0}^{5} C(j) \cdot x(i-j-1) + z(i-6) \\ &= y(i) \end{aligned}$$

That is, in the circuit arrangement shown in FIG. 2, by conforming the phase of the second output sum $\Sigma L$ with that of the first output sum $\Sigma S$ through the delay element 160 and by compensating an insufficient delay time of the second output sum $\Sigma L$ while adding it to the first output sum $\Sigma S$ by the pipeline processing adder 170, a desired output of the transversal filter can be obtained.

The principle operation of the transversal filter in the circuit arrangement shown in FIG. 2 has been so far explained referring to FIG. 4. Hereinafter, the operation of the transversal filter in the circuit arrangement shown in FIG. 2 is briefly explained again referring to FIG. 3, which is the timing chart of FIG. 2. Thus, these elements described in FIG. 5 also correspond to FIG. 3.

The selecting signal S and the clock signal CK1 which is used for the last stage delay element 104 have the period T, while the clock signal CK2 has the period $(T/2=T/n)$. The input signal a, the outputs b, c, d of the tap weight multipliers 110, 111, 112 and the cascade input signal e are entirely the same as those explained in reference to FIG. 5. Therefore, explanations for the signals will be omitted hereafter.

The selecting operation of the selector 180 is operated at the period $(T/2=T/n)$. Thus, by substituting the virtual input k in FIG. 5 by the virtual input k as expressed in the following equation:

$$\alpha(i) = C3.x(i-1) + C4.x(i-2) + C5.x(i-3) + z(i-3)$$

the output f of the adder 122 is expressed as the following equation (see FIG. 3);

C2.x(i−2)+C3.x(i−3)+C4.x(i−4)+C5.x(i−5)+-
z(i−5), C5.x(i−2)+z(i−2),

C2.x(i−1)+C3.x(i−2)+C4.x(i−3)+C5.x(i−4)+-
z(i−4), C5.x(i−1)+z(i−1),

C2.x(i)+C3.x(i−1)+C4.x(i−2)+C5.x(i−3)+-
z(i−3), C5.x(i)+z(i),

C2.x(i+1)+C3.x(i)+C4.x(i−1)+C5.x(i−2)+-
z(i−2), C5.x(i+1)+z(i+1), . . .

Also, by substituting the virtual input k in FIG. 5 by the virtual input as expressed in the following equation;

$$\alpha(i) = C3.x(i-1) + C4.x(i-2) + C5.x(i-3) + z(i-3).$$

The output g of the adder 120 becomes the signal as indicated in FIG. 3.

Here, when paying attention to Phase 1 of the output g having the expression indicated in FIG. 3, the output g contains the factors of all of the tap weights C0, C1, C2, C3, C4, C5 as well as the factor of the input signal $a = \{x(i)\}$. Thus an equation which is the same as the equation (1) is established in the first embodiment as shown in FIG. 2.

Now, delaying Phase 1 of the output g of the adder 120 by (T/2) through the delay element 150 with the period (T/2), and furthermore holding the output g for the period T in the last stage delay element 104, the required output signal $h = \{y(i)\}$ is obtained at the output terminal 102.

Figure 6:
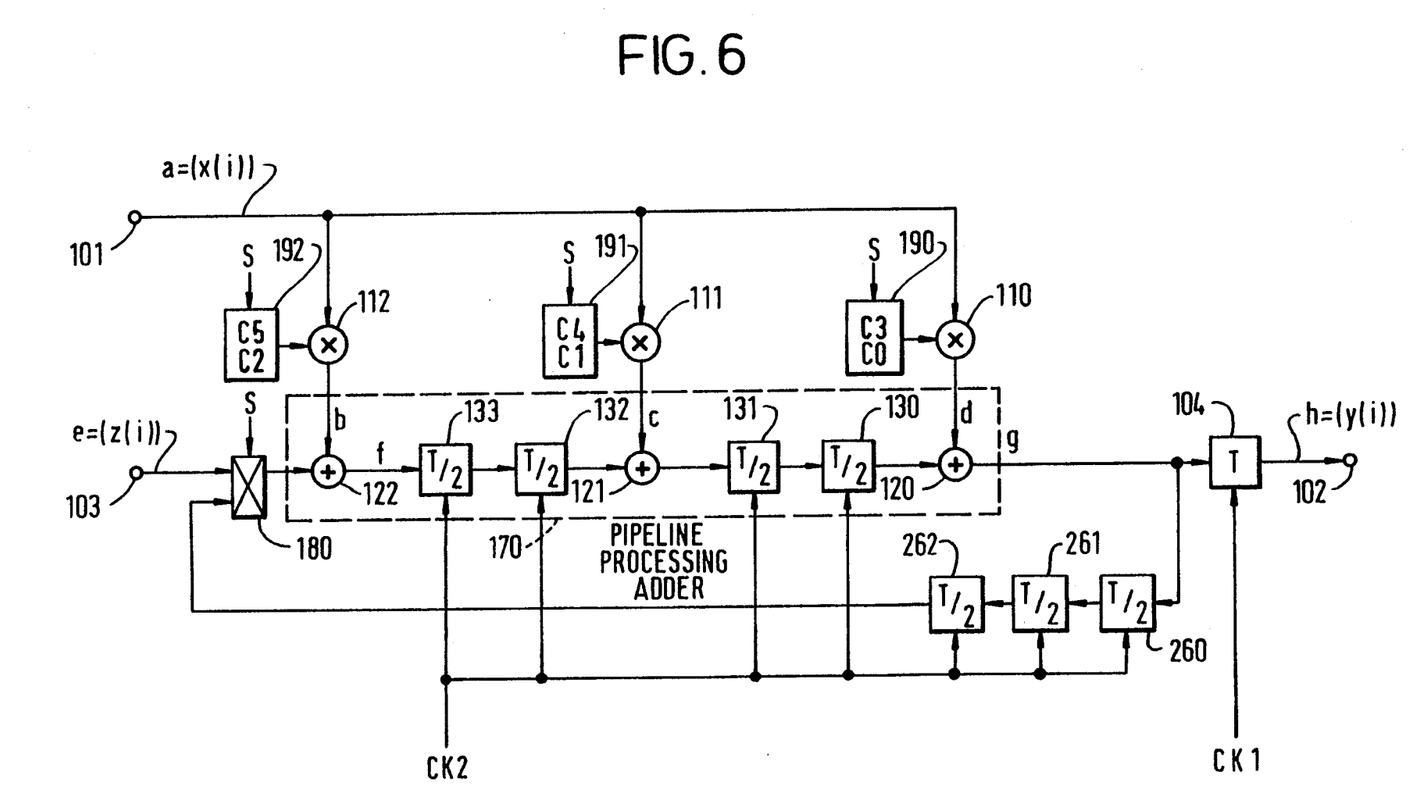
FIG. 6 is a circuit diagram showing a second embodiment of the input-weighted transversal filter according to the present invention.

FIG. 6 shows a second embodiment of the present invention. The second embodiment is embodied in that the scale of 6 taps is also realized by 2 times of time-division multiplexing, similar to the first embodiment. However, the tap weight selecting order is reversed to that of the first embodiment.

The circuit arrangement shown in FIG. 6 is almost the same as that shown in FIG. 2. The big difference is that the registers select the tap weights with larger suffixes (C3, C4, C5) when the selecting signal S is "1" and the tap weights with smaller suffixes (C0, C1, C2) when the selecting signal S is "0". Thus, the transversal filter in the circuit arrangement in the second embodiment can be realized by regulating the delay amount of the feedback passage from the output of the pipeline processing adder 170 to its input and the delay amount between the output of the pipeline processing adder 170 to the last stage delay element 104. That is, the delay element 150 shown in FIG. 2 is omitted in the second embodiment, while the output of the adder 120 is connected directly to the input of the last stage delay element 104. Further, the output of the adder 120 is connected to the input of the selector 180 through the delay elements 260, 261 and 262 having the period $(T/2=T/n)$ and connected in series. The outputs of the sampled signal e and the delay element 262 are supplied to the selector 180 and these 2 signals are selected in the period T. The selector 180 selects the sampled signal e when the selecting signal S is "1" and selects the output of the delay element 262 when the selecting signal S is "0". As to other points; the circuit arrangement shown in FIG. 6 is entirely the same as that shown in FIG. 2 and the reference numerals assigned to the elements in FIG. 6 are also the same as those in FIG. 2 and therefore, detailed explanations of the arrangement of FIG. 6 will be omitted hereafter.

Figure 7:
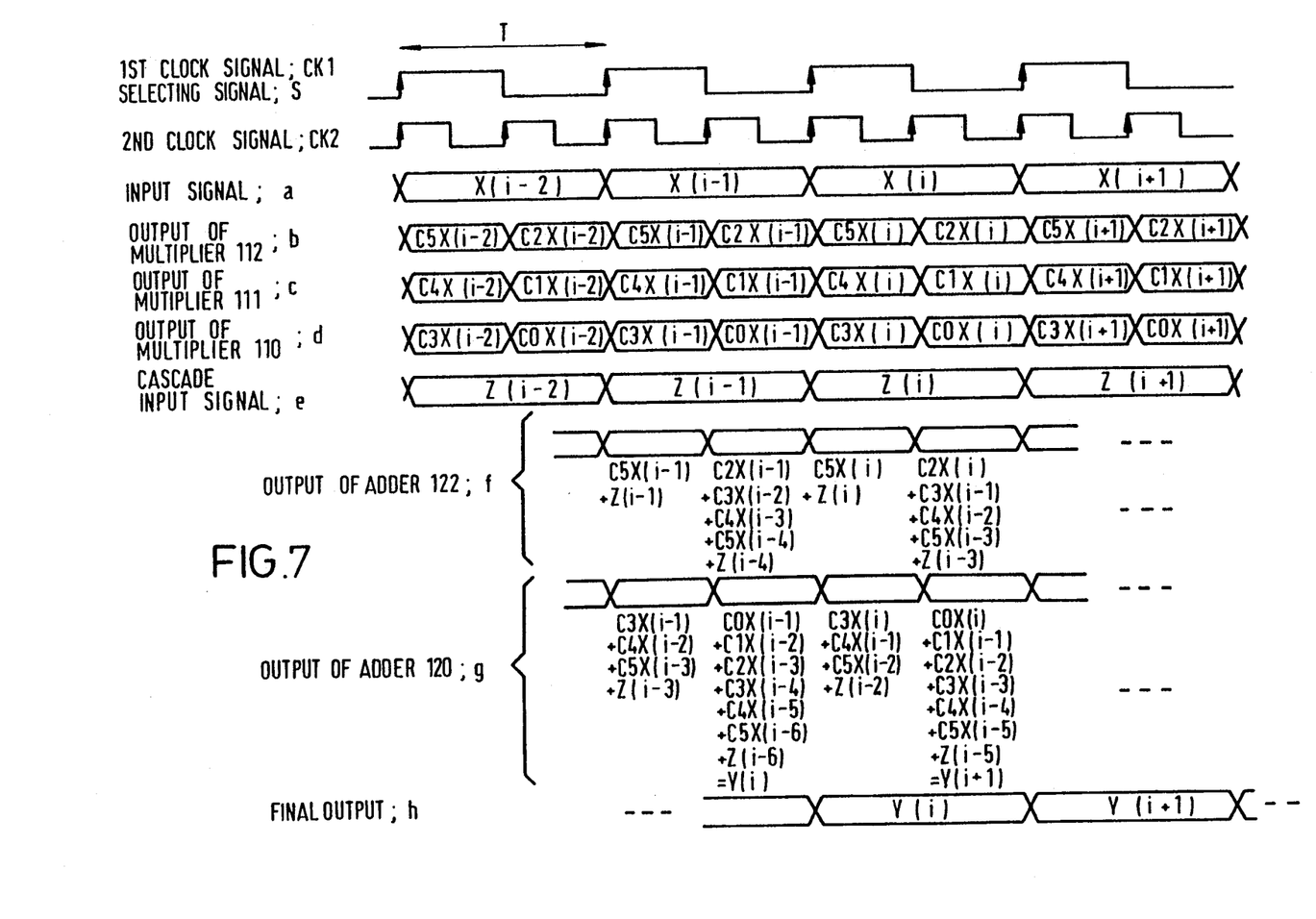
FIG. 7 is a timing chart for explaining the operation of the circuit shown in FIG. 6.

Shown in FIG. 7 is a timing chart for explaining the operation of the second embodiment shown in FIG. 6. All reference letters correspond to the same references described in FIGS. 3 and 5.

As shown in FIG. 7, the selecting signal S and the clock signal CK1 used for the last stage delay element 104 have the same period T, while the clock signal CK2 has the period $(T/2=T/n)$.

As the input signal a is sampled at the period T, the data content of the input signal a changes in the following order:

x(i−2), x(i−1), x(i), x(i+1), . . .

As the tap weights being selected by the period (T/2), the outputs d, c, b of the tap weight multipliers 110, 111, 112 change in following orders:

The output d of the tap weight multiplier 110 is:

C3.x(i−2), C0.x(i−2), C3.x(i−1), C0.x(i−1),
C3.x(i), C0.x(i), C3.x(i+1), C0.x(i+1), . . .

The output c of the tap weight multiplier 111 is:

C4.x(i−2), C1.x(i−2), C4.x(i−1), C1.x(i−1),
C4.x(i), C1.x(i), C4.x(i+1), C1.x(i+1), . . .

The output b of the tap weight multiplier 112:

C5.x(i−2), C2.x(i−2), C5.x(i−1), C2.x(i−1),
C5.x(i), C2.x(i), C5.x(i+1), C2.x(i+1), . . .

Further, as the cascade input signal e being sampled at the period T, the data content of the signal e changes in the following order, at the period of the clock signal CK1 and the "1" and "0" of the selecting signal S:

z(i−2), z(i−1), z(i), z(i+1), . . .

The output g of the adder output 120 is input to the selector 180 through the series connection of the delay elements 260, 261, 262 with the period (T/2). As the selector 180 alternately selects the cascade input signal e and the output g of the adder 120 delayed by the period 1.5 T, at the period (T/2), the output f of the adder 122 changes in the following order:

C5.x(i−2)+z(i−2),

C2.x(i−2)+C3.x(i−3)+C4.x(i−4)+C5.x(i−5)+·
z(i−5), C5.x(i−1)+z(i−1),

C2.x(i−1)+C3.x(i−2)+C4.x(i−3)+C5.x(i−4)+·
z(i−4), C5.x(i)+z(i),

C2.x(i)+C3.x(i−1)+C4.x(i−2)+C5.x(i−3)+·
z(i−3), C5.x(i+1)+z(i+1),

C2.x(i+1)+C3.x(i)+C4.x(i−1)+C5.x(i−2)+·
z(i−2), . . .

The output g of the adder 120 is also indicated in FIG. 7.

In FIG. 7, which only illustrates Phases 1 and 2 during the periods (i−1)T and (i)T, the output g for Phase 2 contains the factors of all of the tap weights C0, C1, C2, C3, C4, C5 as well as the factor of the input signal a={x(i)}. Thus an equation which is the same as the equation (1) is established in the second embodiment as shown in FIG. 6.

When the transversal filter is operated to hold Phase 2 in the last stage delay element 104 for the period T, the desired output signal "h={y(i)}" can be obtained at the output terminal 102.

Thus, the second embodiment is almost the same as the first embodiment except that the tap weight selecting order is changed, and then the number of delay elements is adjusted to fit the selecting order of the selector 180 for returning the output g to the pipeline processing adder 170.

Thus, the second embodiment is one variation from the present invention having a scale of 6 taps, similar to the first embodiment as described above and the two times type of time-division multiplexing.

Figure 8:
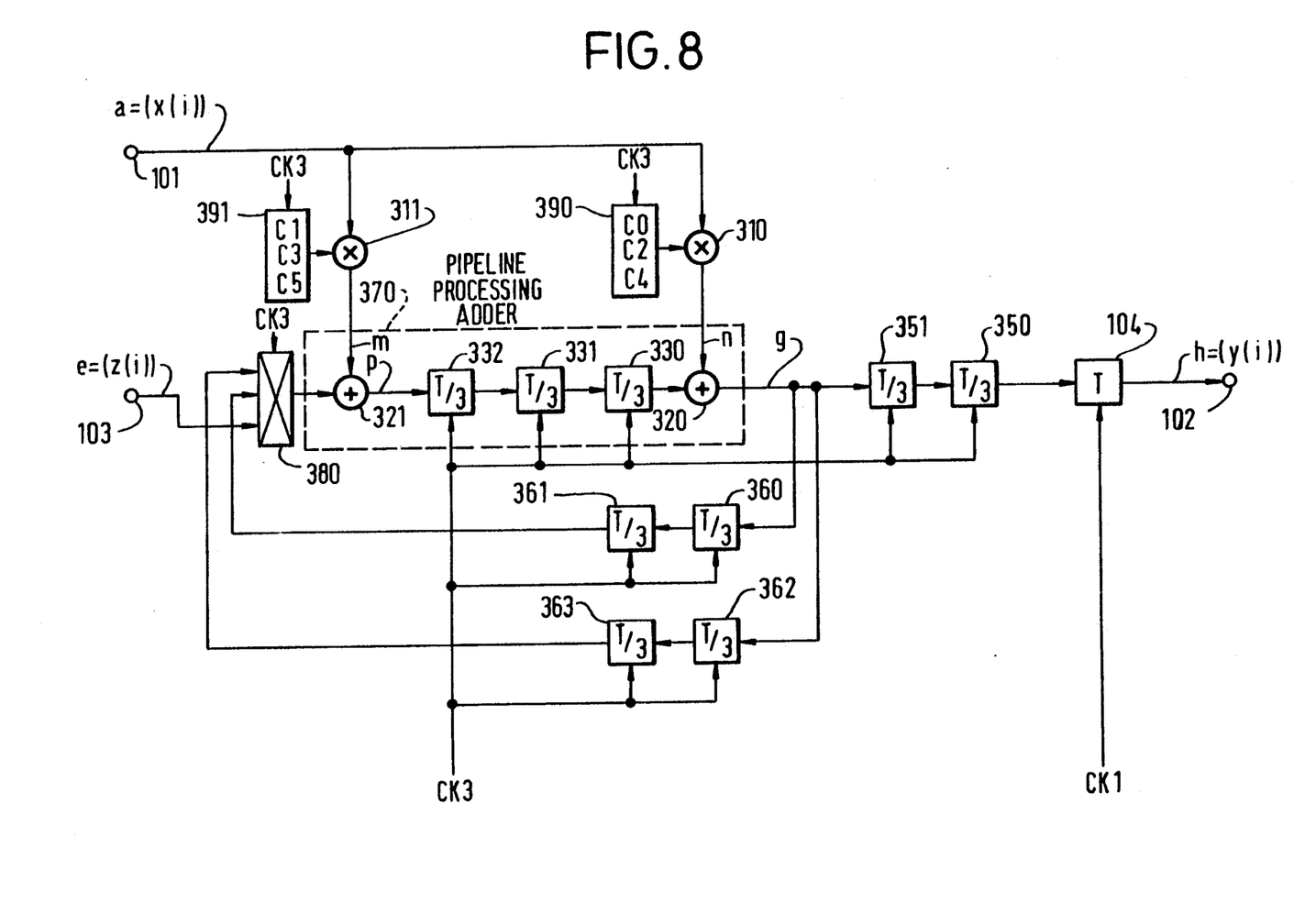
FIG. 8 is a circuit diagram showing a third embodiment of the input-weighted transversal filter according to the present invention.

FIG. 8 shows a third embodiment of the transversal filter according to the present invention. The third embodiment of the transversal filter shows a case where the number of taps k is 6, similar to the first and the second embodiments as described above, while the time of the time-division multiplexing for tap weights is 3.

The input signal a={x(i)}, sampled at every period T, is input to the input terminal 101. This input signal a is then applied to the tap weight multipliers 310, 311. To these tap weight multipliers 310, 311, tap weights from the tap weight registers 390, 391 are supplied, respectively. In each registor three tap weights are selectively applied to the associated multiplier, during the period T. That is, tap weights C0, C2, C4 are selected in the tap weight register 390. Also, tap weights C1, C3, C5 are selected in the tap weight register 391. The tape weight registers 390, 391 are driven by a third clock signal CK3 of the period (T/3) and outputted to the tap weights C0, C1, respectively, at the beginning phase of the sampling clock for the input signal a={x(i)}. The tap weights C2, C3 are outputted to the intermediate phase of the sampling clock. The tap weights C4, C5 are output at the end phase of the sampling clock. Hereinafter, these three phases are called as Phase 1, Phase 2 and Phase 3.

The output of the tap weight multiplier 310 is supplied to the adder 320, while the output of the tap weight multiplier 311 is supplied to the adder 321. Between the adders 320, 321, three delay elements 330, 331, 332 each having the delay time (T/3) are connected in series.

The adders 320, 321 and the delay circuit including the delay elements 330, 331, 332 forms a pipeline processing adder 370.

The outputted of the pipeline processing adder 370 is input to the delay elements 350, 351 each having the delay time (T/3) and connected in series. The output of the delay element 350 is input to the last stage delay element 104 having the delay time T. The output h={y(i)} of this last stage delay element 104 is connected to the output terminal 102. Further, the output of the pipeline processing adder 370 is input to the selector 380 after passing through two feedback passages. One of these feedback passages to the selector 380 passes through delay elements 360, 361 which have the delay time (T/3), respectively, and are connected in series. Another feedback passage to the selector 380 passes through the delay elements 362, 363 which have the delay time (T/3) and are connected in series.

All of these delay elements 330, 331, 332, 350, 351, 360, 361, 362, 363 are driven by the clock signal CK3. While the last stage delay element 104 is driven by the clock signal CK1.

The cascade input signal e={z(i)}, sampled at every period T, is input to the cascade input terminal 103. This sampled signal e is inputted to the selector 380. To this selector 380, the sampled signal e and the outputs of the delay elements 361, 363 are supplied. However, during the period T, these three kinds of signals are changed over three times with each other. The selector 380 selects the output of the delay element 363 at Phase 1, the output of the delay element 361 at Phase 2 and the sampled signal e at Phase 3. The output of the selector 380 is connected to the adder 321 in the pipeline processing adder 370.

Figure 9:
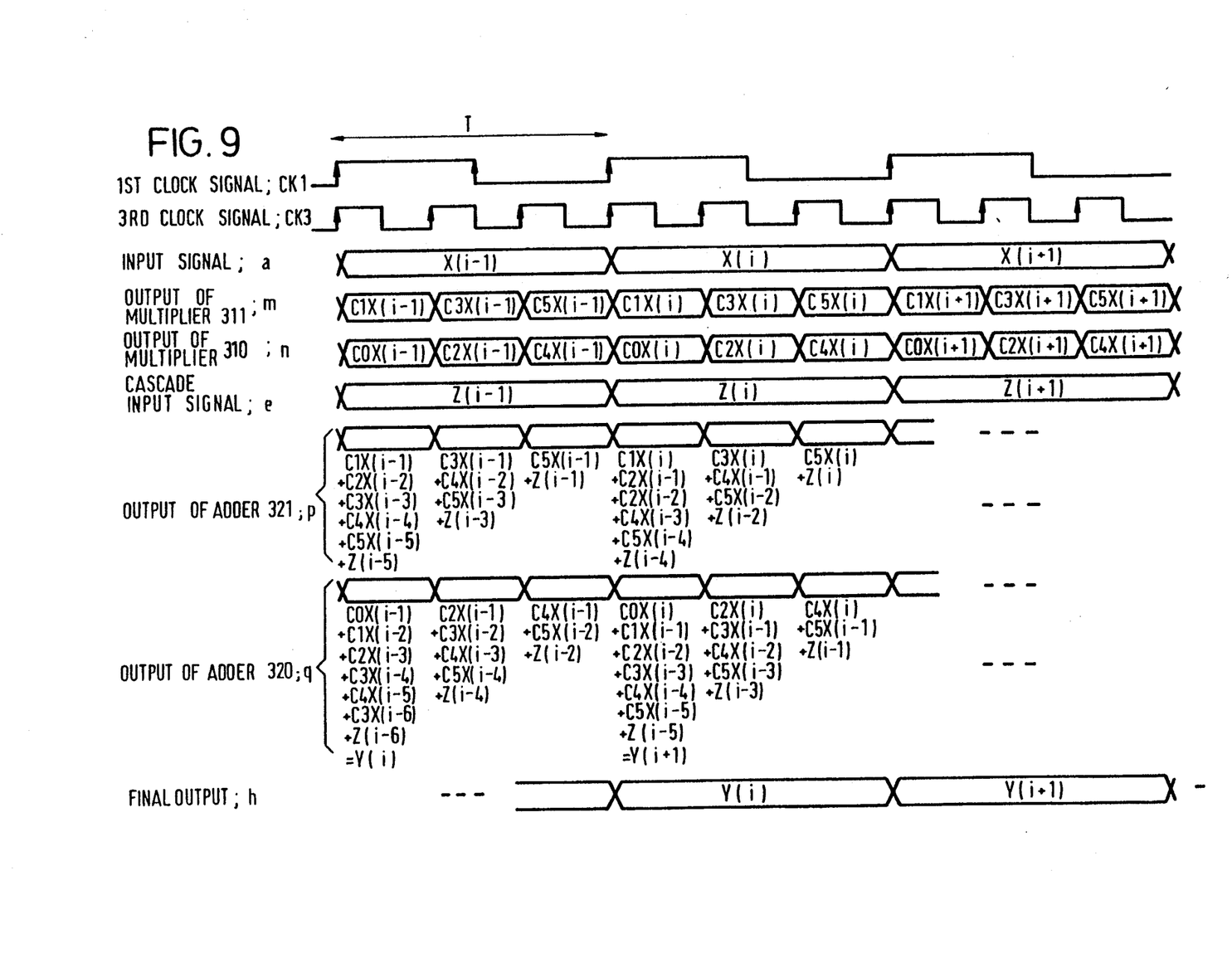
FIG. 9 is a timing chart for explaining the operation of the circuit shown in FIG. 8.

Shown in FIG. 9 is a timing chart for explaining the operation of the transversal filter of the third embodiment according to the present invention. Elements in FIG. 9 correspond to those in FIGS. 3, 5 and 7, except as indicated otherwise in FIGS. 8 and 9.

As shown in FIG. 9, the clock signal CK3 for selecting the tap weights form the tap weight registers 390, 391 has the period equal to the ⅓ of the sampling period T. Accordingly, the input signal a is multiplied with the tap weights from the tap weight registers on the basis of the time-division multiplex. As a result, signals n, m as shown in FIG. 9 are outputted from the multipliers 310, 311. Therefore, similar to the first embodiment, the outputs of the adders 321, 320 will become as shown by signals p, q shown in FIG. 9 respectively. Thus, the output q of the adder 320 at Phase 3 is added to the output p of the adder 321 at Phase 2 through the delay elements 360, 361. Similarly, the output q of the adders 320 at Phase 2 is added to the output p of the adder 321 at Phase 1 through the delay elements 362, 363.

So, if the output q of the adder 320 at every Phase 1 is delayed by (2T/3) in the delay elements 350, 351 each having the period (T/3), and then held in the last stage delay element 104 for the period T, a desired output signal $h = \{y(i)\}$ can be obtained from the output terminal 102.

Hereinabove, three embodiments of the present invention have been explained. However, the present invention is not limited to these three embodiments.

For instance, the first and second embodiments have the same number of taps k, i.e., 6 and the same time of the time-division multiplexing, i.e., 2 times, while they are different from each other at the tap selecting order in the tap weight registers 190, 191, 192. The third embodiment has the number of taps k, which is also 6, and the 3 times of the time-division multiplexing. In the third embodiment, the tap weight selecting order can be changed in various ways. In this case, similar to the case of the 2 times of the time-division multiplexing, the transversal filter like the third embodiment shown in FIG. 8 can be realized by regulating the delay amounts of the two feedback passages between the output and input terminals of the pipeline processing adder 370, the selecting order in the selector 380 for the feedback passages and the delay amount between the output of the pipeline processing adder 370 to the last stage delay element 104. In the third embodiment shown in FIG. 8, the two feedback passages have the same arrangements, but this agreement merely occurs in this case.

Further, in the first embodiment shown in FIG. 2, the delay elements 150, 160 are separated in these two elements. However, this is merely made to explain the principle of the present invention. Thus, the output of the delay element 150 may be connected to the selector 180, but not passing through the delay element 160. Further, in FIG. 6 it is clearly understood that the delay elements 260, 261, 262 can be replaced by two delay elements in total, one having the period (T/2) and the other having the period T. In FIG. 8, the one feedback passage having the delay elements 360, 361 and the other feedback passage having the delay elements 362, 363 are separated from each other, and further the selector 380 has three inputs to be selected. However this is also made to facilitate the explanation of the present invention. That is, it is able to obtain the same result without separating them. Further, it is possible to eliminate the delay elements 360, 361, 362, 363 by applying the output of the delay 350 to the selector 380. Further, for setting the delay amount of the feedback passage, appropriate delay elements may be provided between the selector 380 connected to the feedback passages and the input end of the pipeline processing adder 370.

Further, in the present invention, the cascade input terminal 103 is not compulsory, and it is clearly understood that the circuit arrangement can be made more simple when regarding the cascade input signal $e = 0$.

How the tap weight selecting order and delay amount should be treated or how actual circuits should be constructed are design matters easy for those in the art to figure out. According to the present invention it is possible to realize a transversal filter having an arbitrary number of taps k (k is a natural number not less than 2) using a proper number n of time-division multiplexings.

It is needless to say that the present invention can be implemented in many various manners within the range of the spirit of the present invention.

According to the present invention, when the same number of taps used in the conventional techniques is required, the number of tap weight multipliers which takes a large scale of circuit arrangement in realtime operation filter components can be greatly reduced. Therefore, if the transversal filter is fabricated in IC chips, the chip area becomes small and cost for the same function is reduced. Further, when the transversal filter is allowed the same scale of circuit arrangement as conventional filters, the number of taps can be increased substantially so that it becomes possible to realize effective hardware, especially by using the filter in deghosting devices, etc.

As described above, the present invention can provide an extremely preferable input-weighted transversal filter.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. An input-weighted transversal filter comprising:

input means for receiving a sampled input signal having predetermined sampled time periods;

register means for storing a plurality of sets of tap weight values and selectively supplying one of said sets in a predetermined order at each of the predetermined time periods;

a plurality of tap weight multipliers for multiplying the sampled input signal by the corresponding tap weight values supplied from the register means in the predetermined order, each of the tap weight multipliers generating a corresponding tap weight output signal;

pipeline processing adder means for successively adding each of the tap weight output signals from the tap weight multipliers to a pipeline signal applied thereto and generating a corresponding sum-output signal, said pipeline signal being delayed at integer multiples of the predetermined time periods; and feedback means for inputting the sum-output signal to a predetermined input of the pipeline processing adder means with a delay of $$\left(\frac{m}{n} \times T\right),$$

wherein n is an integer greater than 1, m is a positive integer less than n, and T is the predetermined time period.

2. The input-weighted transversal filter as claimed in claim 1, wherein the pipeline processing adder means includes a plurality of adders which add the tap weight output signals to the pipeline signal and are connected in series by a plurality of delay means, each of the delay means being connected in series between two adjacent adders of the plurality of adders, and the delay means includes n delay elements connected in series, each of the delay elements having a delay period of T/n for coupling the plurality of adders.

3. An input-weighted transversal filter comprising:
input means for receiving a sampled input signal having predetermined sampled time periods;
register means for storing a plurality of sets of tap weight values and selectively supplying one of said sets in a predetermined order at the predetermined time periods;
a plurality of tap weight multipliers for multiplying the sampled input signal by the corresponding tap weight values supplied from the register means in the predetermined order, each of the tap weight multipliers generating a corresponding tap weight output signal;
pipeline processing adder means for successively adding each of the tap weight output signals from the tap weight multipliers to a pipeline signal applied thereto and generating a corresponding sum-output signal, said pipeline signal being delayed at integer multiples of the predetermined time periods; and
feedback means for inputting a selected signal to a predetermined input of the pipeline processing adder means, the feedback means including a selector for selectively inputting the selected signal to the predetermined input of the pipeline processing adder means for at least a time interval of 1/n within the predetermined time periods, wherein n is an integer greater than 1.

* * * * *